(12) United States Patent  
Emerson et al.

(10) Patent No.: US 7,795,623 B2
(45) Date of Patent: Sep. 14, 2010

(54) LIGHT EMITTING DEVICES HAVING CURRENT REDUCING STRUCTURES AND METHODS OF FORMING LIGHT EMITTING DEVICES HAVING CURRENT REDUCING STRUCTURES

(75) Inventors: David Todd Emerson, Durham, NC (US); Kevin Haberern, Cary, NC (US); Michael John Bergmann, Chapel Hill, NC (US); David B. Slater, Jr., Raleigh, NC (US); Matthew Donofrio, Raleigh, NC (US); John Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 519 days.

(21) Appl. No.: 11/715,687

(22) Filed: Mar. 8, 2007

(65) Prior Publication Data

US 2008/0217635 A1  Sep. 11, 2008

Related U.S. Application Data

(63) Continuation-in-part of application No. 11/881,814, filed on Jun. 30, 2004, now abandoned.

(51) Int. Cl.
    *H01L 27/15* (2006.01)
(52) U.S. Cl. .................................. 257/79; 257/E33.005
(58) Field of Classification Search .......... 257/E33.005, 257/79
    See application file for complete search history.

(56) References Cited

U.S. PATENT DOCUMENTS 4,864,370 A   9/1989 Gaw et al.

(Continued)

FOREIGN PATENT DOCUMENTS

DE        4338187 A1    5/1995

(Continued)

OTHER PUBLICATIONS

Notification of Transmittal of the International Search Report and the Written Opinion of the International Searching Authority, or the Declaration, International Search Report and Written Opinion of the International Searching Authority, PCT Application No. PCT/US2008/002140, Dec. 16, 2008.

(Continued)

*Primary Examiner*—Zandra Smith
*Assistant Examiner*—Paul E Patton
(74) *Attorney, Agent, or Firm*—Myers Bigel Sibley & Sajovec

(57) ABSTRACT

A light emitting device includes a p-type semiconductor layer, an n-type semiconductor layer, and an active region between the n-type semiconductor layer and the p-type semiconductor layer. A non-transparent feature, such as a wire bond pad, is on the p-type semiconductor layer or on the n-type semiconductor layer opposite the p-type semiconductor layer, and a reduced conductivity region is in the p-type semiconductor layer or the n-type semiconductor layer and is aligned with the non-transparent feature. The reduced conductivity region may extend from a surface of the p-type semiconductor layer opposite the n-type semiconductor layer towards the active region and/or from a surface of the n-type semiconductor layer opposite the p-type semiconductor layer towards the active region.

47 Claims, 11 Drawing Sheets

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,048,035 A | 9/1991 | Sugawara et al. | 372/45 |
| 5,210,051 A | 5/1993 | Carter, Jr. | 437/107 |
| 5,245,622 A | 9/1993 | Jewell et al. | |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,789,768 A | 8/1998 | Lee et al. | 257/96 |
| 5,793,062 A | 8/1998 | Kish, Jr. et al. | 257/98 |
| 5,912,477 A | 6/1999 | Negley | 257/95 |
| 6,057,562 A | 5/2000 | Lee et al. | |
| 6,120,600 A | 9/2000 | Edmond et al. | 117/89 |
| 6,165,809 A | 12/2000 | Kurahashi | 438/29 |
| 6,177,688 B1 | 1/2001 | Linthicum et al. | 257/77 |
| 6,187,606 B1 | 2/2001 | Edmond et al. | 438/46 |
| 6,201,262 B1 | 3/2001 | Edmond et al. | 257/77 |
| 6,258,614 B1 | 7/2001 | Kaneko | |
| 6,376,269 B1 | 4/2002 | Chen et al. | 438/29 |
| 6,420,732 B1 | 7/2002 | Kung et al. | 257/79 |
| 6,455,343 B1 | 9/2002 | Chen et al. | |
| 6,853,010 B2 | 2/2005 | Slater, Jr. et al. | |
| 6,919,585 B2 | 7/2005 | Liu | |
| 6,933,169 B2 | 8/2005 | Shibata et al. | |
| 7,009,214 B2 * | 3/2006 | Yang et al. | 257/98 |
| 2001/0050530 A1 | 12/2001 | Murakami et al. | 313/498 |
| 2002/0123164 A1 | 9/2002 | Slater, Jr. et al. | 438/39 |
| 2002/0137243 A1 | 9/2002 | Chen et al. | |
| 2002/0163007 A1 | 11/2002 | Matsumoto et al. | |
| 2003/0006418 A1 | 1/2003 | Emerson et al. | 257/79 |
| 2003/0146445 A1 | 8/2003 | Hen | |
| 2003/0180980 A1 | 9/2003 | Margalith et al. | 438/48 |
| 2004/0016934 A1 | 1/2004 | Murakami et al. | 257/97 |
| 2004/0056260 A1 | 3/2004 | Slater, Jr. et al. | 257/79 |
| 2004/0066820 A1 | 4/2004 | Johnson et al. | |
| 2005/0082558 A1 | 4/2005 | Yang et al. | |
| 2006/0002442 A1 | 1/2006 | Haberern et al. | |
| 2006/0163586 A1 | 7/2006 | Denbaars et al. | |

FOREIGN PATENT DOCUMENTS

| | | |
|---|---|---|
| DE | 198 17 368 A1 | 12/1998 |
| EP | 0 911 887 A2 | 4/1999 |
| EP | 0 929 109 A1 | 7/1999 |
| GB | 2280061 A | 1/1995 |
| JP | 03089568 | 4/1991 |
| JP | 05235408 | 9/1993 |
| JP | 11-186607 A | 7/1999 |
| JP | 2000-294837 A | 10/2000 |
| JP | 2001-77414 A | 3/2001 |
| JP | 200185742 | 3/2001 |
| JP | 2002064221 | 2/2002 |
| JP | 2003-17748 A | 1/2003 |
| JP | 2004-172189 A | 6/2004 |
| WO | WO 03/058772 A2 | 7/2003 |
| WO | WO 03/058772 A3 | 7/2003 |
| WO | WO 03/061021 A2 | 7/2003 |
| WO | WO 03/061021 A3 | 7/2003 |
| WO | WO-2005/117147 A1 | 12/2005 |

OTHER PUBLICATIONS

Margalith et al. "Ion Implantation for Current Confinement in InGaN-based RCLEDs," *4th International Symposium on Blue Laser and Light Emitting Diodes*, Mar. 2002.

Invitation to Pay Additional Fees, Annex to Form PCT/ISA/206—Communication Relating to the Results of the Partial International Search, PCT/US2005/010868, May 3, 2006.

Lee et al. "Characteristics of Top-Surface-Emitting GaAs Quantum-Well Lasers" *IEEE Photonics Technology Letters* 2(9):686-688 (1990).

Yoo et al. "Fabrication of Vertical-Cavity Front-Surface-Emitting Laser Diode (FSELD) Using a Heterojunction Bipolar Transistor Process" *Japanese Journal of Applied Physics* 30(3B):L492-L494 (1991.

Notification of Transmittal of the International Search Report and the Written Opinion of the International Searching Authority, or the Declaration, International Search Report, Written Opinion of the International Searching Authority, PCT/US2005/010868, Aug. 17, 2006.

Invitation to Pay Additional Fees and, Where Applicable, Protest Fee corresponding to International Application No. PCT/US2008/002140, Mailed Jul. 4, 2008 (8 Pages).

* cited by examiner

LIGHT EMITTING DEVICES HAVING CURRENT REDUCING STRUCTURES AND METHODS OF FORMING LIGHT EMITTING DEVICES HAVING CURRENT REDUCING STRUCTURES

RELATED APPLICATION

The present application is a continuation-in-part of U.S. patent application Ser. No. 10/881,814, filed on Jun. 30, 2004, now abandoned.

FIELD OF THE INVENTION

This invention relates to semiconductor light emitting devices and fabricating methods therefor.

BACKGROUND

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. As is well known to those having skill in the art, a light emitting diode or laser diode, generally includes a diode region on a microelectronic substrate. The microelectronic substrate may be, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

Much development interest and commercial activity recently has focused on LEDs that are fabricated in or on silicon carbide, because these LEDs can emit radiation in the blue/green portions of the visible spectrum. See, for example, U.S. Pat. No. 5,416,342 to Edmond et al., entitled Blue Light-Emitting Diode With High External Quantum Efficiency, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency.

The efficiency of conventional LEDs may be limited by their inability to emit all of the light that is generated by their active region. When an LED is energized, light emitting from its active region (in all directions) may be prevented from exiting the LED by, for example, a non-transparent wire bond pad. Typically, in gallium nitride based LEDs, a current spreading contact layer is provided to improve the uniformity of carrier injection across the cross section of the light emitting device. Current is injected into the p-side of the LED through the bond pad and the p-type contact. Light generated in an active region of the device is proportional to the carrier injection. Thus, a substantially uniform photon emission across the active region may result from the use of a current spreading layer, such as a substantially transparent p-type contact layer. However, a wire bond pad is typically not a transparent structure and, therefore, photons emitted from the active region of the LED that are incident upon the wire bond pad may be absorbed by the wire bond pad. For example, in some instances approximately 70% of the light incident on the wire bond pad may be absorbed. Such photon absorption may reduce the amount of light that escapes from the LED and may decrease the efficiency of the LED.

SUMMARY

A light emitting device according to some embodiments of the invention includes a p-type semiconductor layer, an n-type semiconductor layer, and an active region between the n-type semiconductor layer and the p-type semiconductor layer. A non-transparent feature is on the p-type semiconductor layer or on the n-type semiconductor layer opposite the p-type semiconductor layer, and a reduced conductivity region is in the p-type semiconductor layer and is aligned with the non-transparent feature. The reduced conductivity region extends from a surface of the p-type semiconductor layer opposite the n-type semiconductor layer towards the active region. The non-transparent region may include a wire bond pad, a passivation region, and/or a current spreading finger.

The light emitting device may further include a substrate including first and second opposing surfaces, and the n-type semiconductor may be on the first surface of the substrate and the wire bond pad may be on the second surface of the substrate opposite the n-type semiconductor layer.

The light emitting device may further include a metal stack on the surface of the p-type semiconductor layer. The metal stack may include an ohmic layer directly on the p-type semiconductor layer, a reflective layer on the ohmic layer, and a bonding layer on the reflective layer. The light emitting device may further include a barrier layer between the reflective layer and the bonding layer.

The reduced conductivity region may extend from the surface of the p-type semiconductor layer to/into/through the active region. The reduced conductivity region may extend through the p-type semiconductor layer, the active region and into or through the n-type semiconductor layer.

The wire bond pad may be in contact with the reduced conductivity region, and the light emitting device may further include an ohmic contact on the n-type semiconductor layer adjacent and in electrical contact with the wire bond pad.

The active region may include a Group III-nitride based active region. The reduced conductivity region may include an insulating region and/or a region that is not non-transparent. In some embodiments, the reduced conductivity region may include an implanted region. The reduced conductivity region may correspond to a region of damage at an interface between the metal stack and the p-type semiconductor layer. The region of damage may include a wet or dry etched region of the p-type semiconductor layer, a region of the p-type semiconductor layer exposed to a high energy plasma, a region of the p-type semiconductor layer exposed to $H_2$ and/or a region of the p-type semiconductor layer exposed to a high energy laser.

A light emitting device according to further embodiments of the invention includes a p-type semiconductor layer, an n-type semiconductor layer, and an active region between the n-type semiconductor layer and the p-type semiconductor layer. The device includes a non-transparent feature on the n-type semiconductor layer opposite the p-type semiconductor layer, and a metal contact on a surface of the p-type semiconductor layer opposite the n-type semiconductor layer. The metal contact forms on ohmic contact to the p-type semiconductor layer in a region other than a reduced conductivity area of the surface of the p-type semiconductor layer that is aligned with the non-transparent feature. The non-transparent region may include a wire bond pad, a passivation region, and/or a current spreading finger The light emitting device may further include a reduced conductivity region in the p-type semiconductor layer and aligned with the non-transparent feature and the reduced conductivity area, and the reduced conductivity region may extend from the surface of the p-type semiconductor layer towards the active region.

The light emitting device may further include a reduced conductivity region in the n-type semiconductor layer and aligned with the non-transparent feature, the reduced conductivity region extending from a surface of the n-type semiconductor layer opposite the p-type semiconductor layer towards the active region.

The light emitting device may further include a non-ohmic contact on the surface of the p-type semiconductor layer. The non-ohmic contact may include a metal that does not form an ohmic contact with the p-type semiconductor layer and/or an insulator on the surface of the p-type semiconductor layer.

A light emitting device according to further embodiments of the invention includes a p-type semiconductor layer, an n-type semiconductor layer, and an active region between the n-type semiconductor layer and the p-type semiconductor layer. The device further includes a wire bond pad on the n-type semiconductor layer opposite the p-type semiconductor layer, and a reduced conductivity region in the n-type semiconductor layer and aligned with the wire bond pad. The reduced conductivity region extends from a surface of the n-type semiconductor layer opposite the p-type semiconductor layer towards the active region. The device further includes an ohmic contact on the n-type semiconductor layer adjacent and in electrical contact with the wire bond pad.

The light emitting device may further include a metal stack on a surface of the p-type semiconductor layer opposite the n-type semiconductor layer. The metal stack may include an ohmic layer directly on the p-type semiconductor layer, a reflective layer on the ohmic layer, and a bonding layer on the reflective layer.

The reduced conductivity region may include a first reduced conductivity region, and the light emitting device may further include a second reduced conductivity region in the p-type semiconductor layer and aligned with the wire bond pad. The second reduced conductivity region may extend from a surface of the p-type semiconductor layer opposite the n-type semiconductor layer towards the active region.

The light emitting device may further include a metal contact on a surface of the p-type semiconductor layer opposite the n-type semiconductor layer. The metal contact forms on ohmic contact to the p-type semiconductor layer in a region other than a reduced conductivity area of the surface of the p-type semiconductor layer that is aligned with the wire bond pad.

Methods according to some embodiments of the invention include forming a p-type semiconductor layer, an n-type semiconductor layer, and an active region between the n-type semiconductor layer and the p-type semiconductor layer, forming a non-transparent feature on the n-type semiconductor layer opposite the p-type semiconductor layer, and forming a reduced conductivity region in the p-type semiconductor layer and aligned with the non-transparent feature. The reduced conductivity region extends from a surface of the p-type semiconductor layer opposite the n-type semiconductor layer towards the active region.

Methods of forming a light emitting device according to further embodiments of the invention include forming a p-type semiconductor layer, an n-type semiconductor layer, and an active region between the n-type semiconductor layer and the p-type semiconductor layer, forming a wire bond pad on the n-type semiconductor layer opposite the p-type semiconductor layer, and forming a metal contact on a surface of the p-type semiconductor layer opposite the n-type semiconductor layer. The metal contact forms on ohmic contact to the p-type semiconductor layer in a region other than a reduced conductivity area of the surface of the p-type semiconductor layer that is aligned with the wire bond pad.

A light emitting device according to further embodiments of the invention includes a p-type semiconductor layer, an n-type semiconductor layer, and an active region between the n-type semiconductor layer and the p-type semiconductor layer. A bond pad is on the p-type semiconductor layer opposite the n-type semiconductor layer, and a reduced conductivity region is in the p-type semiconductor layer and aligned with the bond pad. The reduced conductivity region extends from a surface of the p-type semiconductor layer opposite the n-type semiconductor layer towards the active region.

The light emitting device may further include a reflector between the bondpad and the p-type semiconductor layer, and/or a current spreading finger on the p-type semiconductor layer, and the reduced conductivity region may further be aligned with the current spreading finger.

DETAILED DESCRIPTION OF EMBODIMENTS OF THE INVENTION

Figure 1:
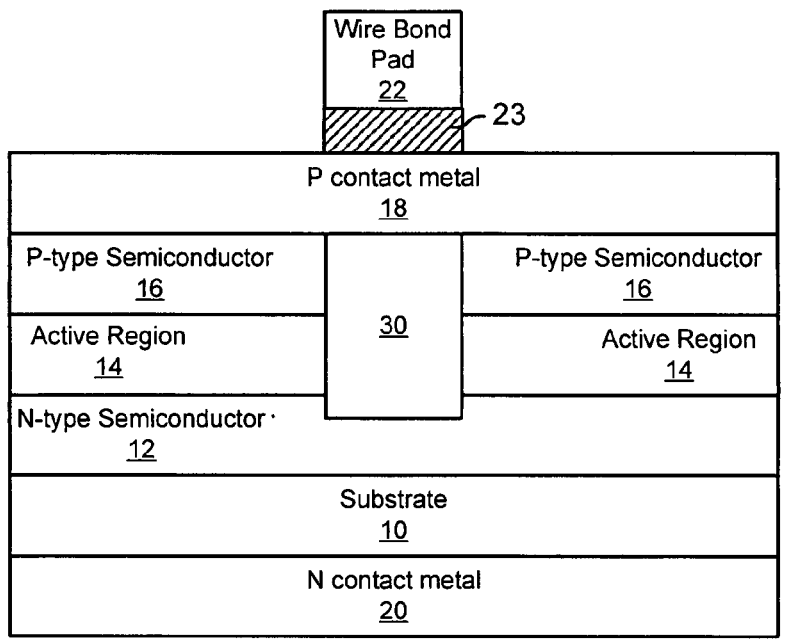
FIG. 1 is a cross-sectional view illustrating semiconductor light emitting devices having a current blocking structure according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Some embodiments of the present invention may provide for improved efficacy of a light emitting device by reducing and/or preventing current flow in an active region of the device in a region beneath a wire bond pad or other non-transparent structure. Thus, some embodiments of the present invention may provide light emitting devices and methods of fabricating light emitting devices having a current blocking mechanism below the wire bond pad. By reducing and/or preventing current from being injected directly beneath the wire bond pad, the current may be more likely to be converted to photon emission in areas of the device not under the wire bond pad. Thus, there may be a reduced probability of light being absorbed by the wire bond pad. In some embodiments of the present invention, an increase in efficiency of a light emitting device according to some embodiments of the present invention may be proportional to the size of the wire bond pad.

Embodiments of the present invention may be particularly well suited for use in nitride-based light emitting devices such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leqq x \leqq 1$ are often used to describe them. However, while embodiments of the present invention are described herein with reference to Group III-nitride based light emitting devices, such as gallium nitride based light emitting devices, certain embodiments of the present invention may be suitable for use in other semiconductor light emitting devices, such as for example, GaAs and/or GaP based devices.

Light emitting devices according to some embodiments of the present invention may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green LEDs may be provided. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LED and/or laser structures are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. These structures may be modified as described herein to provide blocking structures according to some embodiments of the present invention.

Thus, for example, embodiments of the present invention may be utilized with light emitting devices having bond pads of differing shapes or sizes. The light emitting devices may be on differing substrates, such as silicon carbide, sapphire, gallium nitride, silicon or other substrate suitable substrate for providing Group III-nitride devices. The light emitting devices may be suitable for subsequent singulation and mounting on a suitable carrier. The light emitting devices may include, for example, single quantum well, multi-quantum well and/or bulk active region devices. Some embodiments of the present invention may be used with devices utilizing a tunneling contact on the p-side of the device.

FIG. 1 is a cross-sectional schematic illustration of a light emitting device according to some embodiments of the present invention. As seen in FIG. 1, a substrate 10, such as an n-type silicon carbide substrate, has an optional n-type semiconductor layer 12, such as a gallium nitride based layer, provided thereon. The n-type semiconductor layer 12 may include multiple layers, for example, buffer layers or the like. In some embodiments of the present invention, the n-type semiconductor layer 12 is provided as an AlGaN layer, that may be of uniform or gradient composition, and/or a GaN layer. The n-type semiconductor layer 12 may be doped, for example, with silicon, germanium and/or tellurium.

While described herein with reference to a silicon carbide substrate, in some embodiments of the present invention other substrate materials may be utilized. For example, a sapphire substrate, GaN or other substrate material may be utilized. In such a case, the contact 20 may be located, for example, in a recess that contacts the n-type semiconductor layer 12, so as to provide a second contact for the device. Other configurations may also be utilized.

An active region 14, such as a single or double heterostructure, quantum well, multi-quantum well or other such active region may be provided on the n-type semiconductor layer. As used herein, the term "active region" refers to a region of semiconductor material of a light emitting device, that may be one or more layers and/or portions thereof, where a substantial portion of the photons emitted by the device when in operation are generated by carrier recombination. In some embodiments of the present invention, the active region refers to a region where substantially all of the photons emitted by the device are generated by carrier recombination.

Also illustrated in FIG. 1 is an optional p-type semiconductor layer 16. The p-type semiconductor material layer 16 may, for example, be a gallium nitride based layer, such as a GaN layer. In particular embodiments of the present invention, the p-type semiconductor layer 16 includes magnesium doped GaN. The p-type semiconductor layer 16 may include one or multiple layers and may be of uniform or gradient composition. In some embodiments of the present invention, the p-type semiconductor layer 16 is part of the active region 14.

A first contact metal layer 18 of contact metal that provides an ohmic contact to the p-type semiconductor material layer 16 is also provided. In some embodiments, the first contact metal layer 18 may function as a current spreading layer. In particular embodiments of the present invention where the p-type semiconductor material layer 16 is GaN, the first contact metal layer 18 may include Pt, indium-tin-oxide (ITO) or another transparent material that can form an ohmic contact to p-type GaN. In certain embodiments of the present invention, the first contact metal layer 18 is light permeable and in some embodiments is substantially transparent. In some embodiments, the first contact metal layer 18 may be a relatively thin layer of Pt. For example, the first contact metal layer 18 may be a layer of Pt that is about 15 Å thick. An optional reflective layer 23 may be provided on the first metal contact layer 18. A wire bond pad 22 or other light absorbing (or otherwise non-transparent) feature is provided on the first contact metal layer 18. In the embodiments illustrated in FIG. 1, the wire bond pad 22 is provided on the reflective layer 23, so that the reflective layer 23 is between the wire bond pad 22 and the p-type semiconductor material layer 16. In some embodiments, a current spreading finger 154A (FIG. 13) may be on the first contact metal layer 18.

A second contact metal layer 20 of contact metal that provides an ohmic contact to the n-type semiconductor material is also provided. The second contact metal layer 20 may be provided on a side of the substrate 10 opposite the active region 14. As discussed above, in some embodiments of the present invention the second contact metal layer may be provided on a portion of the n-type semiconductor material layer 12, for example, in a recess or at a base of a mesa including the active region. Furthermore, in some embodiments of the present invention, an optional back-side implant or additional epitaxial layers may be provided between the substrate 10 and the second contact metal layer 20.

As is further illustrated in FIG. 1, a reduced conductivity region 30 is provided in the active region 14. The reduced conductivity region 30 may be positioned beneath light absorbing and/or non-transparent features and/or regions of the device. For example, as shown in FIG. 1, the reduced conductivity region 30 may be positioned beneath the wire bond pad 22. A reduced conductivity region 30 may also be positioned beneath other features of the chip, such as passivation regions along an edge of the chip, current spreading fingers on a surface of the chip, or other features or areas of the chip that may tend to absorb light emitted by the chip.

In some embodiments of the present invention, the reduced conductivity region 30 extends through the active region 14. As used herein, reduced conductivity refers to a region with reduced current flow over other portions of the active region. In particular embodiments, the reduction is at least an order of magnitude and in some embodiments, substantially all current flow is blocked in the reduced conductivity region.

As noted above, in some embodiments of the present invention the reduced conductivity region 30 extends through the active region 14. In further embodiments of the present invention, the reduced conductivity region 30 extends from the first contact metal layer 18 to the active region 14. In some embodiments, the reduced conductivity region extends from the first contact layer 18 into the active region 14. In some embodiments, the reduced conductivity region extends from the first contact layer 18 through the active region 14. The reduced conductivity region 30 may have substantially the same shape and/or area as the area of the wire bond pad 22 on the first contact metal layer 18. In some embodiments of the present invention, the reduced conductivity region 30 has a slightly larger area than the wire bond pad 22 while in other embodiments of the present invention, the reduced conductivity region 30 has a slightly smaller area than the wire bond pad 22. In certain embodiments of the present invention, the reduced conductivity region 30 does not absorb light or only absorbs a relatively small amount of light. In some embodiments of the present invention, the reduced conductivity region 30 is an insulating region.

The reduced conductivity region 30 may reduce and/or prevent current flow through the active region 14 in the area beneath the wire bond pad 22, so that carriers have a tendency to be injected in areas other than the reduced conductivity region 30. Thus, the presence of the reduced conductivity region 30 may reduce and/or prevent light generation through carrier recombination in this region. While not being bound by a particular theory of operation, this may be the case because the likelihood that a photon generated in the portion of the active region beneath the wire bond pad 22 is absorbed by the wire bond pad 22 may be higher than if the photon is generated in a portion of the active region that is not beneath the wire bond pad 22. By reducing and/or eliminating the light generated in the active region beneath the wire bond pad 22, the portion of the light generated by the light emitting device that is absorbed by the wire bond pad 22 may be reduced. For a given set of operating conditions, this reduction in the amount of light absorbed by the wire bond pad 22 may result in increased light extraction from the light emitting device as compared to a device operating under the same conditions where light is generated in the region beneath the wire bond pad 22. Thus, some embodiments of the present invention provide a reduced conductivity region 30 that extends into and, in some embodiments, through the active region 14 in the area beneath the wire bond pad 22. This may reduce the likelihood that carriers may spread and be injected into the active region 14 beneath the wire bond pad 22 and, thereby, result in photon generation in the area beneath the wire bond pad 22.

Figure 2A:
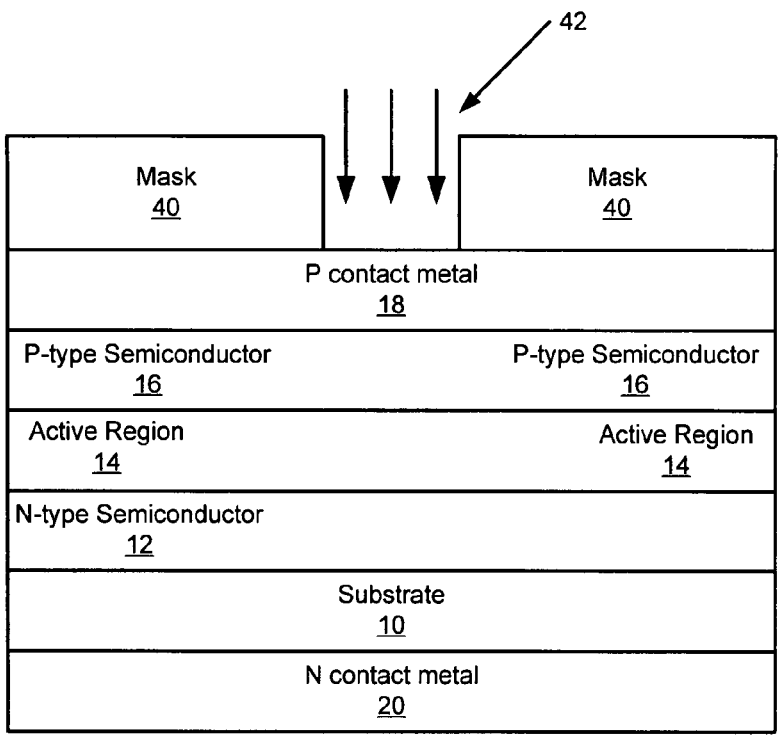
FIGS. 2A and 2B are cross-sectional views illustrating fabrication of semiconductor devices according to some embodiments of the present invention.
Figure 2B:
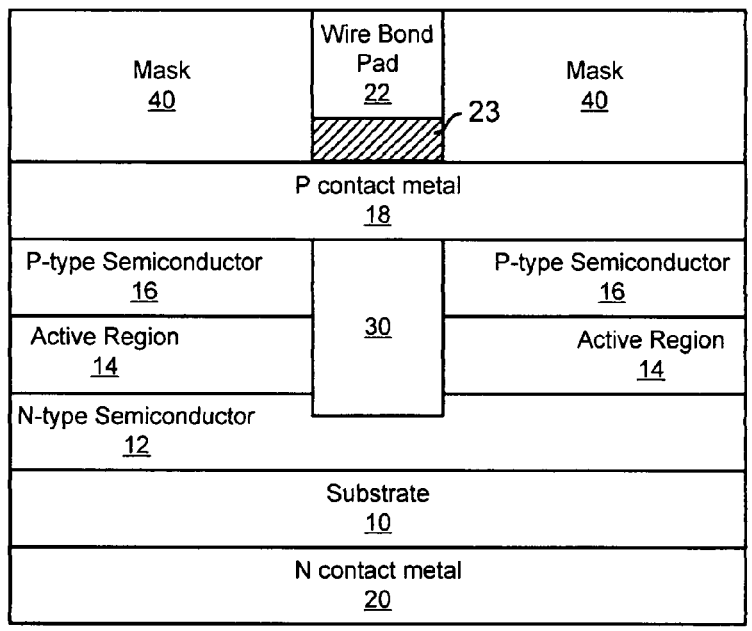

FIGS. 2A and 2B illustrate operations according to some embodiments of the present invention for forming light emitting devices having a reduced conductivity region as illustrated in FIG. 1. As seen in FIG. 2A, the various layers/regions of the light emitting device are fabricated. The particular operations in the fabrication of the light emitting device will depend on the structure to be fabricated and are described in the United States Patents and/or Applications incorporated by reference above and/or are well known to those of skill in the art and, therefore, need not be repeated herein. FIG. 2A also illustrates formation of a mask 40 having a window 42 corresponding to the region where the wire bond pad 22 is to be formed.

An implant is performed using the mask 40 so as to implant atoms into the active region 14 in the region of the wire bond pad 22 so as to form the reduced conductivity region 30 as seen in FIG. 2B. Such an implant may, for example, be a nitrogen implant. For example, for a gallium nitride based device, implant conditions of 60 keV, $2 \times 10^{13}$ cm$^{-3}$ N$_2$ may produce a non-absorbing and insulating region in Mg doped GaN. The particular implant energy and/or atoms may depend on the structure in which the reduced conductivity region 30 is formed.

As seen in FIG. 2B, after implantation, the wire bond pad 22 may be formed in the window 42. In some embodiments, a reflective layer 23 may be formed in the window 42 prior to formation of the wire bond pad 22. Thus, in some embodiments of the present invention, the wire bond pad 22 (and possibly the reflective layer 23) and the reduced conductivity region 30 may be self-aligned. The wire bond pad 22 may be formed, for example, by forming a layer or layers of metal and then planarizing the layers to provide the wire bond pad 22. The mask 40 may subsequently be removed. Optionally, the mask 40 may be made of an insulating material, such as SiO$_2$ and/or AlN, and may remain on the device as, for example, a passivation layer, or be removed.

Figure 3:
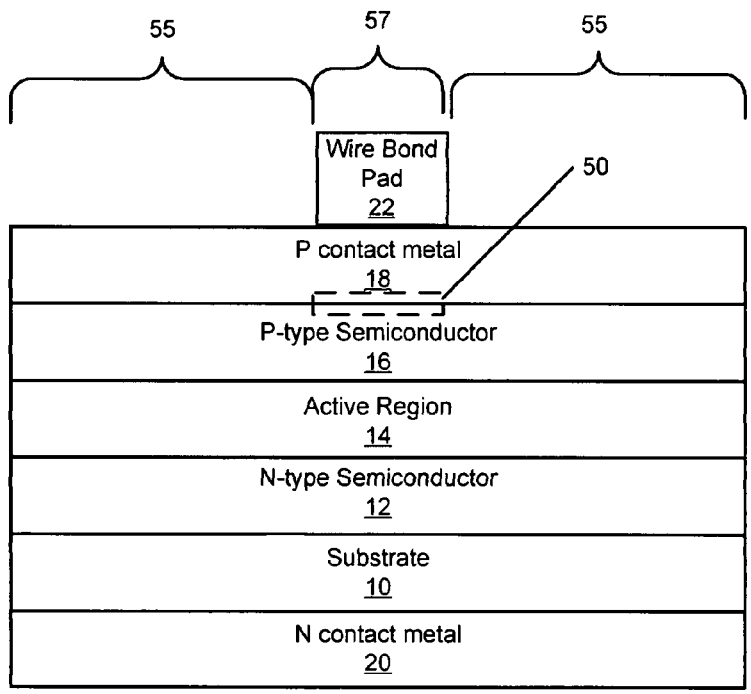
FIGS. 3 through 11 are cross-sectional views of light emitting devices according to further embodiments of the present invention.

FIG. 3 illustrates light emitting devices according to further embodiments of the present invention. In FIG. 3, the first contact metal layer 18 includes a first portion 55 in contact with the p-type semiconductor material layer 16 that provides an ohmic contact to the p-type semiconductor material layer 16 and a second portion 57 in contact with the p-type semiconductor material layer 16 that does not form an ohmic contact to the p-type semiconductor material layer 16. As used herein the term "ohmic contact" refers to a contact with a specific contact resistivity of less than about 10 e-03 ohm-cm$^2$ and, in some embodiments less than about 10 e-04 ohm-cm$^2$. Thus, a contact that is rectifying or that has a high specific contact resistivity, for example, a specific contact resistivity of greater than about 10 e-03 ohm-cm$^2$, is not an ohmic contact as that term is used herein.

The second portion 57 corresponds to the location of the wire bond pad 22. By not forming an ohmic contact, current injection into the p-type semiconductor material layer 16 in the portion 57 may be reduced and/or prevented. The portion 57 that does not form an ohmic contact may be provided by damaging the p-type semiconductor layer 16 and/or the first contact metal layer 18 in the region 50 beneath the wire bond pad 22.

For example, in gallium nitride based devices, the quality of the interface between the contact metal and the p-type semiconductor material may determine the quality of the resulting ohmic contact. Thus, for example, the p-type semiconductor material layer 16 in the region 50 may be exposed to a high energy plasma, such as Ar, to reduce p-type conductivity before formation of the first contact metal layer 18. Also, the p-type semiconductor material layer 16 and the first contact metal layer 18 in the region 50 may be exposed to a high energy plasma to damage the metal/GaN interface after formation of the first contact metal layer 18. The p-type semiconductor material 16 in the region 50 may be exposed to a H$_2$ while protecting the other regions of the p-type semiconductor material layer 16 before formation of the first contact metal layer 18. The p-type semiconductor material 16 in the region 50 may be wet or dry etched while protecting the other regions of the p-type semiconductor material layer 16 before formation of the first contact metal layer 18. Also, the p-type semiconductor material layer 16 in the region 50 may be exposed to a high energy laser while protecting the other regions of the p-type semiconductor material 16 before formation of the first contact metal layer 18.

Such selective damaging of the p-type semiconductor material layer 16 and/or metal layer 18 may be provided, for example, using a mask such as described above with reference to FIGS. 2A and 2B and/or by controlling a laser. The particular conditions utilized may vary depending on the procedure utilized and the composition of the p-type semiconductor material layer 16 and/or the first metal contact layer 18.

Figure 4A:
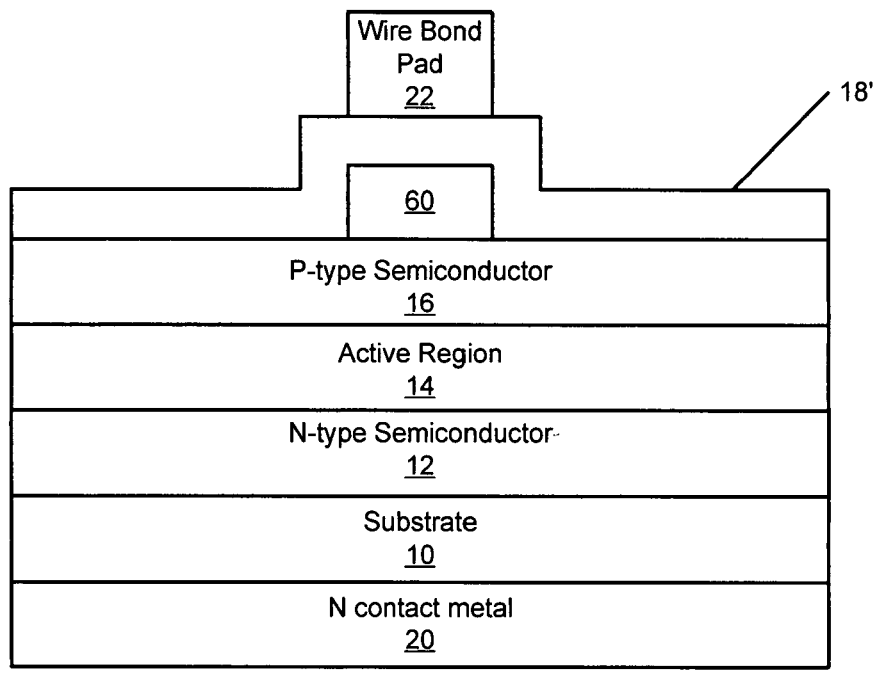

FIG. 4A illustrates light emitting devices according to further embodiments of the present invention. In FIG. 4A, a Schottky contact 60 is provided on the p-type semiconductor material layer 16 and the first contact metal layer 18' formed on the p-type semiconductor material layer 16 and the Schottky contact 60. The wire bond pad 22 is provided on the portion of the first contact metal layer 18' on the Schottky contact 60. By forming a Schottky contact 60, current injection into the p-type semiconductor material layer 16 from the first contact metal layer 18' may be reduced and/or prevented in the region of the Schottky contact 60.

Figure 4B:
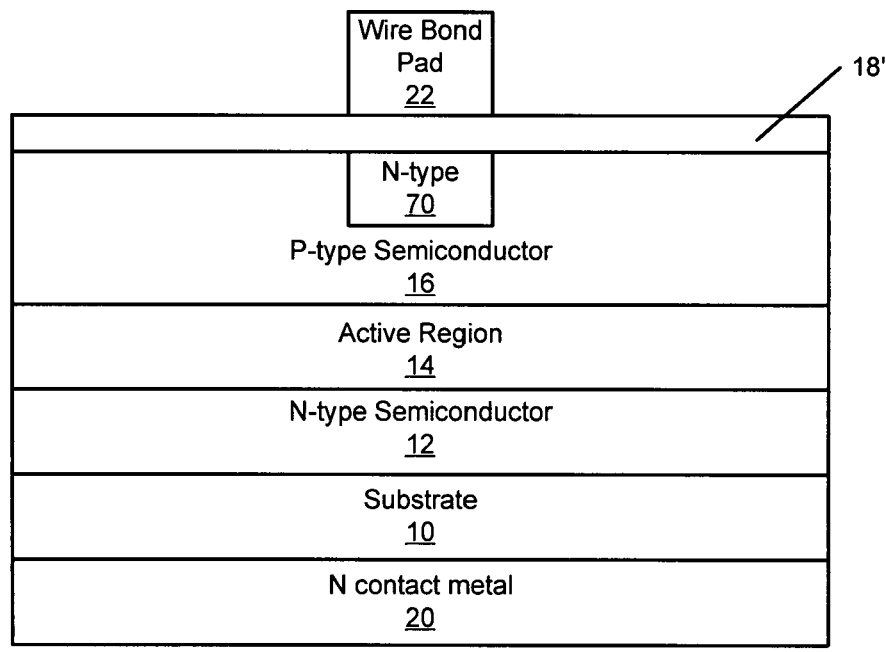

Alternatively, as shown in FIG. 4B, a rectifying junction may be provided in the region below the wire bond pad 22. The rectifying junction may be provided, for example, by implanting the p-type semiconductor material layer 16 with n-type ions so as to convert the region 70 beneath the wire bond pad 22 to n-type semiconductor material. Such an implant may, for example, be carried out using a mask such as discussed above with reference to FIGS. 2A and 2B. Alternatively, a region of n-type material could be formed where the Schottky contact 60 is illustrated in FIG. 4A and the first contact metal 18' could be formed on the region of n-type semiconductor material and the p-type semiconductor material layer 16.

Figure 5:
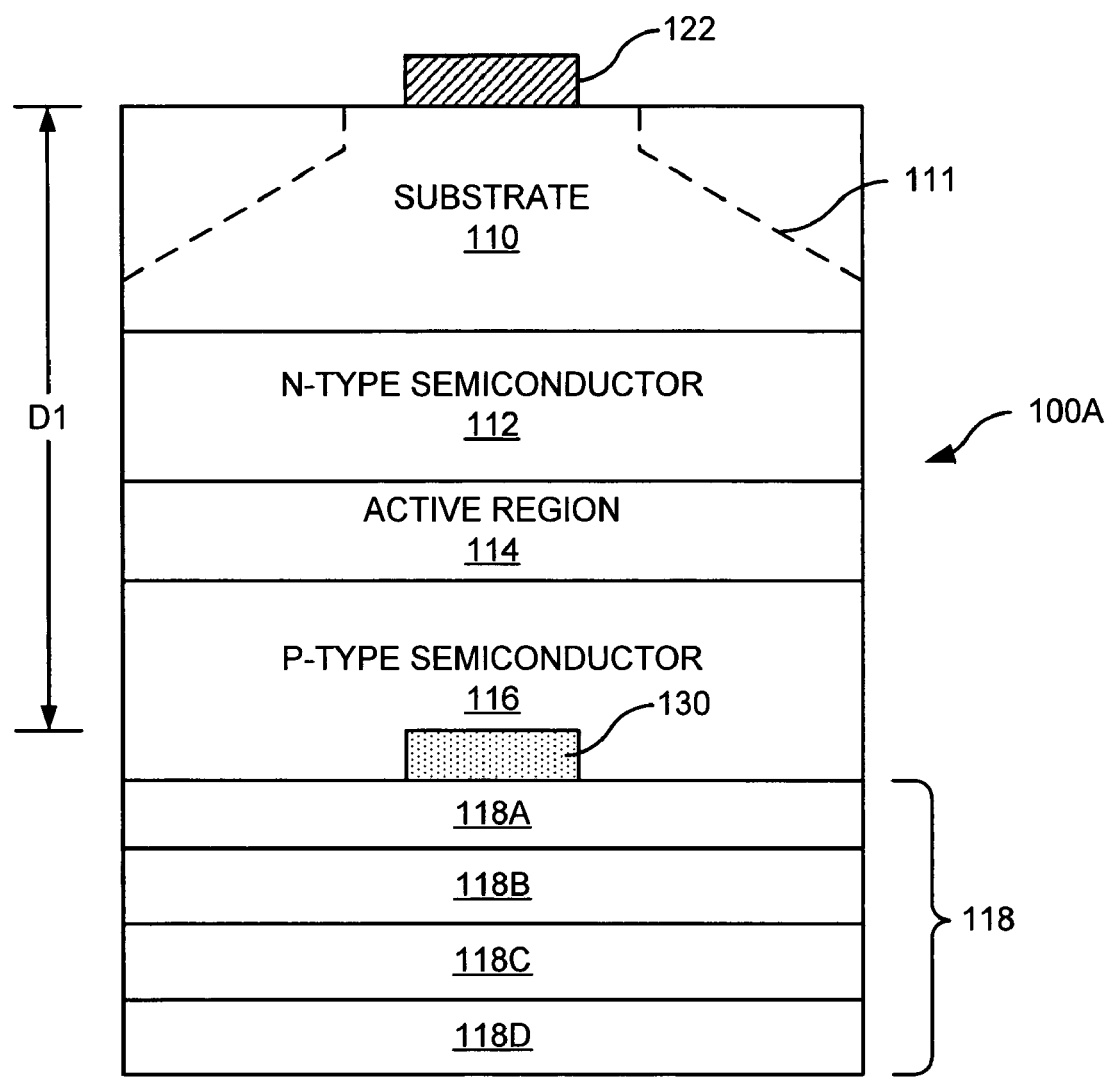

Referring to FIG. 5, some embodiments of the invention provide a light emitting device 100A including a substrate 110 on which an n-type semiconductor layer 112, an active region 114 and a p-type semiconductor layer 116 are formed. The semiconductor substrate 110 may include a conductive silicon carbide substrate, for example, and the n-type semiconductor layer 112, the active region 114 and the p-type semiconductor layer 116 may include group III-nitride based semiconductor layers. The light emitting device 100A further includes a reduced conductivity region 130 in the p-type semiconductor layer 116. As seen in FIG. 5, the substrate 110 may include shaped sidewalls 111 that may increase the efficiency of light extraction from the device 100A by changing the angle at which light generated in the active region 114 strikes the sidewalls of the device 100A. In the structure illustrated in FIG. 5, the reduced conductivity region 130 may be located a distance D1 from the bond pad 122 of about 50 to 400 μm. The reduced conductivity region 130 may be formed using any of the methods described above, including implantation of ions into the p-type semiconductor layer 116.

The light emitting device 100A may be suitable for so-called "flip chip" mounting on an underlying support. In particular, the semiconductor structure may be mounted on a submount, bond pad or other surface with the p-type semiconductor layer 116 facing down and the substrate 110 facing up. In order to facilitate bonding the light emitting device 100A to a support, a p-contact metal stack 118 is formed on exposed surface of the type semiconductor layer 116. Appropriate metal stacks for flip chip mounting of optoelectronic devices are disclosed for example in U.S. Patent Publication No. 2003/0015721 entitled "Light Emitting Diodes Including Modifications For Submount Bonding And Manufacturing Methods Therefor," the disclosure of which is incorporated herein by reference. In particular, the p-contact metal stack 118 may include an ohmic layer 118A of a metal, such as platinum, that makes an ohmic contact with the p-type semiconductor layer 116. The metal stack 118 may further include a reflective layer 118B, a barrier layer 118C and/or a bonding layer 118D.

The bonding layer 118D may include gold and/or tin, and may be provided to facilitate thermosonic and/or thermocompression bonding of the device 100A to a submount. The reflective layer 118B may include a reflective metal, such as silver or aluminum, and may be provided to reflect light away from a submount and back into the device 100A so that it may be usefully extracted. The barrier layer 118C may include a metal, such as tungsten, titanium, titanium nitride and/or nickel, that may prevent the metal of the bonding layer 118D from contaminating the ohmic metal 118A and/or the reflector 118B. Barrier layers may be formed as described in U.S. Patent Publication No. 2005/0194603 entitled "Light Emitting Diodes Including Barrier Layers/Sublayers And Manufacturing Methods Therefor," the disclosure of which is incorporated herein by reference. An optional adhesion layer (not shown) may be provided between the barrier layer 118C and the bonding layer 118D.

When an optoelectronic device, such as the device 100A shown in FIG. 5, is mounted on an opaque support member with the p-side of the device 100A facing down (i.e towards the support), it may not be necessary to form a transparent electrode or a current spreading layer on the exposed substrate 110, since the conductivity of the substrate 110 may be high enough that current may spread naturally in the device. Accordingly, as shown in FIG. 5, the device may include a wire bond pad 122 formed on the substrate 110. An ohmic contact (not shown) may be formed between the wire bond pad 122 and the substrate 110. In some embodiments, the ohmic contact may be formed in self-alignment with the bond pad 122.

The reduced conductivity region 130 may extend from a surface of the p-type semiconductor layer 116 opposite the active region 114 into the p-type semiconductor layer 116. The reduced conductivity region 130 may extend partially and/or completely through the p-type semiconductor layer 116. In some embodiments, including embodiments that include a substrate 110, the reduced conductivity region 130 may extend completely through the active region 114 to/into the n-type semiconductor layer 112. The reduced conductivity region 130 may be formed using techniques such as those described above with respect to FIGS. 1-4. For example, the reduced conductivity region 130 may be formed by implanting ions into the p-type semiconductor layer 116 through a mask, as described above with reference to FIG. 2A.

As further shown in FIG. 5, the reduced conductivity region 130 may be generally aligned with the bond pad 122. Since the p-type semiconductor layer 116 may be relatively thin compared, for example, to the substrate 110, and since current may not spread readily in the p-type semiconductor layer 116, the presence of the reduced conductivity region 130 may reduce the number of photons generated in the device 100A directly beneath the wire bond pad 122. Accordingly, the reduced conductivity region 130 may have a shape that is about the same shape as the wire bond pad 122. Furthermore, the reduced conductivity region 130 may have an area that is about the same as, slightly less than or slightly greater than, the area of the wire bond pad 122. In some embodiments, the reduced conductivity region may have a diameter that is about 6 to about 30 μm larger than the diameter of the bond pad 122. In particular, bond pad 122 may have a diameter of about 100 to 105 μm, and the reduced conductivity region 130 may have a diameter that is about 14 μm larger than the diameter of the bond pad 122. In embodiments including a substrate (i.e. in which the substrate 110 has not been removed), it may be desirable to provide a reduced conductivity region 130 that is larger in area than the bond pad 122. For example, if the wire bond pad 122 has a circular shape, the reduced conductivity region 130 may also have a circular shape with an area that is less than, about equal to, or slightly greater than the diameter of the wire bond pad 122.

Figure 6A:
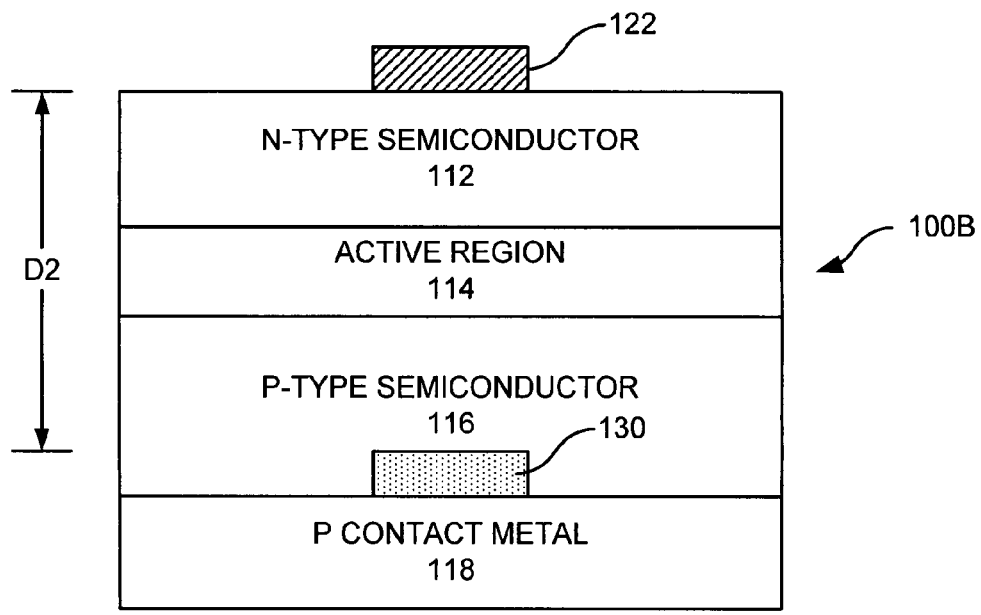
Figure 6B:
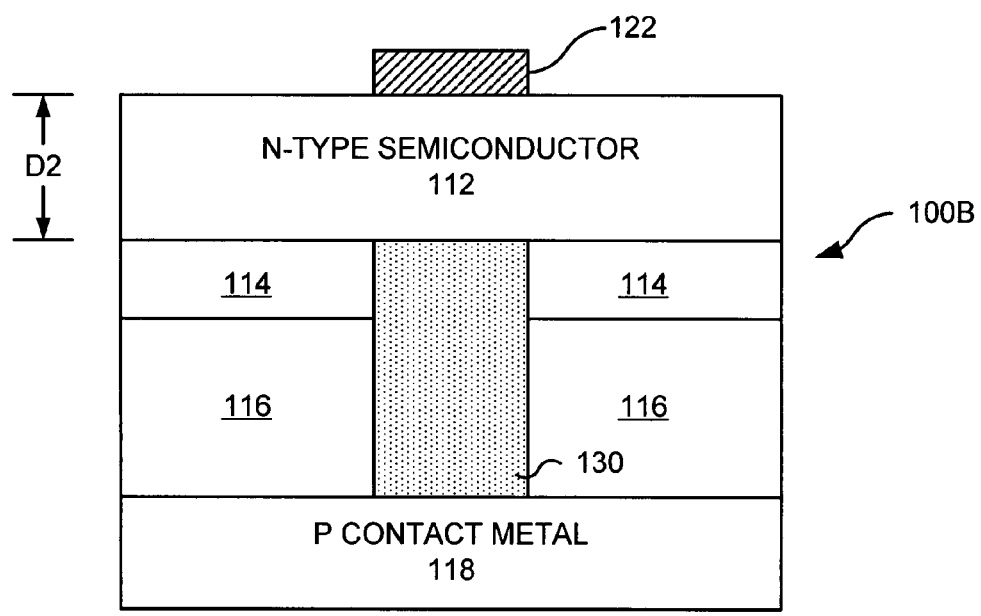

Further embodiments of the invention are shown in FIGS. 6A and 6B in which a light emitting device 100B is shown including a p-type semiconductor layer 116 an active region 114 and an n-type semiconductor layer 112. A p-contact metal stack 118 is formed on a surface of the p-type semiconductor layer 116, and a wire bond pad 122 is formed on a surface of the n-type semiconductor layer 112 opposite the p-type semiconductor layer 116. In particular, the light emitting device 100B shown in FIGS. 6A and 6B may not include a substrate.

As further shown in FIG. 6A, a reduced conductivity region 130 is provided in the p-type semiconductor layer 116 generally aligned with the wire bond pad 122. The reduced conductivity region 130 may extend from a surface of the p-type semiconductor layer 116 opposite the active region 114 into the p-type semiconductor layer 116. The reduced conductivity region 130 may extend partially and/or completely through the p-type semiconductor layer 116. The reduced conductivity region 130 may have an area that is equal to, greater than, or less than the area of the wire bond pad 122. The reduced conductivity region 130 may be located within the device 100B a distance D2 from the wire bond pad 122. In some embodiments, the distance D2 may be from 0.3 to 10 μm. In particular, the distance D2 may be about 2 to 3 μm.

Figure 11A:
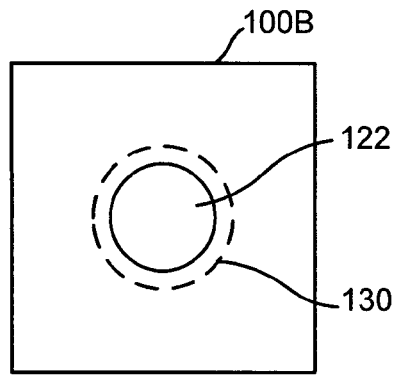
Figure 11B:
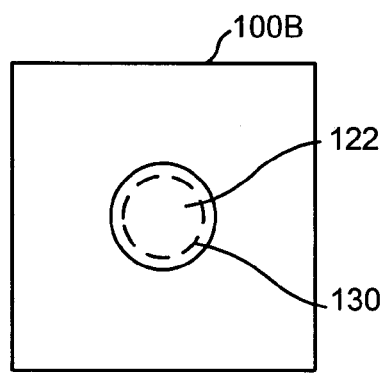
Figure 11C:
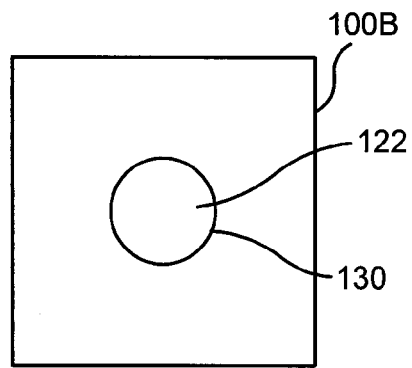

FIGS. 11A-11C are plan view illustrations of a light emitting device 100B including a wire bond pad 122 and an aligned reduced conductivity region 130. As shown therein, the reduced conductivity region 130 may have a peripheral shape that is similar to the peripheral shape of the wire bond pad 122, which in the embodiments illustrated in FIGS. 11A-11C is generally circular. The wire bond pad 122 and the reduced conductivity region 130 may have other peripheral shapes, such as rectangular, star, cross or other shape or combination of shapes.

As shown in FIG. 11A, the reduced conductivity region 130 may have an area that is slightly larger than the area of the wire bond pad 122 in some embodiments, while in other embodiments the reduced conductivity region 130 may have an area that is slightly less than (FIG. 11B) or about equal to (FIG. 11C) the area of the wire bond pad 122.

Referring to FIG. 6B, the reduced conductivity region 130 may extend completely through the p-type semiconductor layer 116 and into the active region 114. In some embodiments, including embodiments that do not include a substrate, the reduced conductivity region 130 may extend completely through the active region 114 to/into the n-type semiconductor layer 112.

Figure 7A:
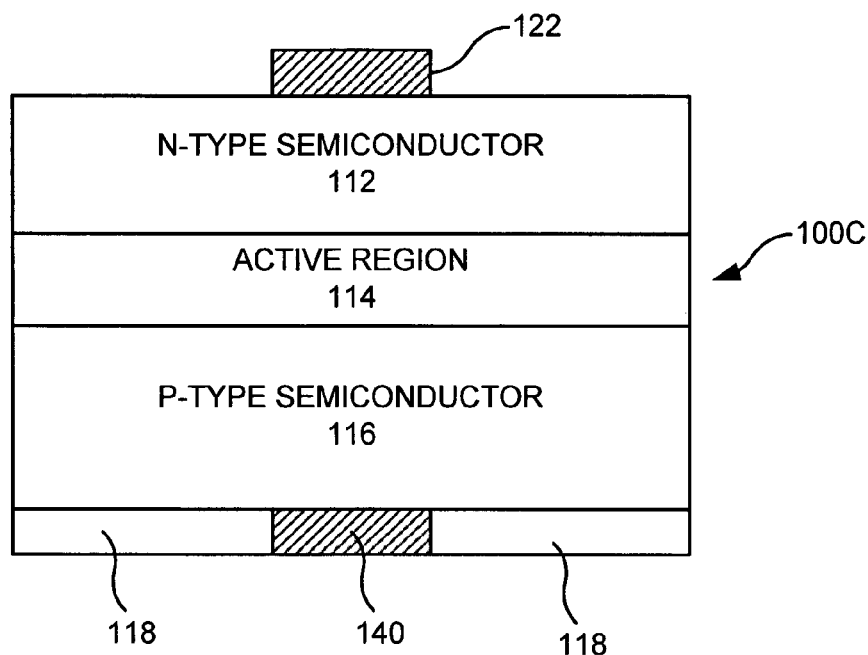

Further embodiments of the invention are shown in FIG. 7A, which illustrates a light emitting device 100C that includes a p-type semiconductor layer 116, an active region 114 and an n-type semiconductor layer 112. A wire bond pad 122 is formed on a surface of the n-type semiconductor layer 112. A patterned ohmic contact 118 is formed on a surface of the p-type semiconductor layer 116 opposite the n-type semiconductor layer 112. The light emitting device 100C also includes a non-ohmic contact 140 on the p-type semiconductor layer 116 opposite the wire bond pad 122. In some embodiments, the non-ohmic contact 140 may include, for example, a rectifying Schottky contact. The formation of rectifying Schottky contacts on nitride-based semiconductor materials is well known to those skilled in the art. In other embodiments, the non-ohmic contact 140 may include a non-conductive material, such as silicon dioxide.

The non-ohmic contact 140 may have a shape that is about the same as the shape of the wire bond pad 122. The contact 140 may have an area that is slightly less than, about equal to, or slightly greater than the area of the wire bond pad 122. Accordingly, when a voltage is applied across the terminals of the device 100C, current may not flow from the non-ohmic contact 140 into the p-type semiconductor layer 116, which may reduce the number of photons generated in the active layer 114 beneath the wire bond pad 122.

Figure 7B:
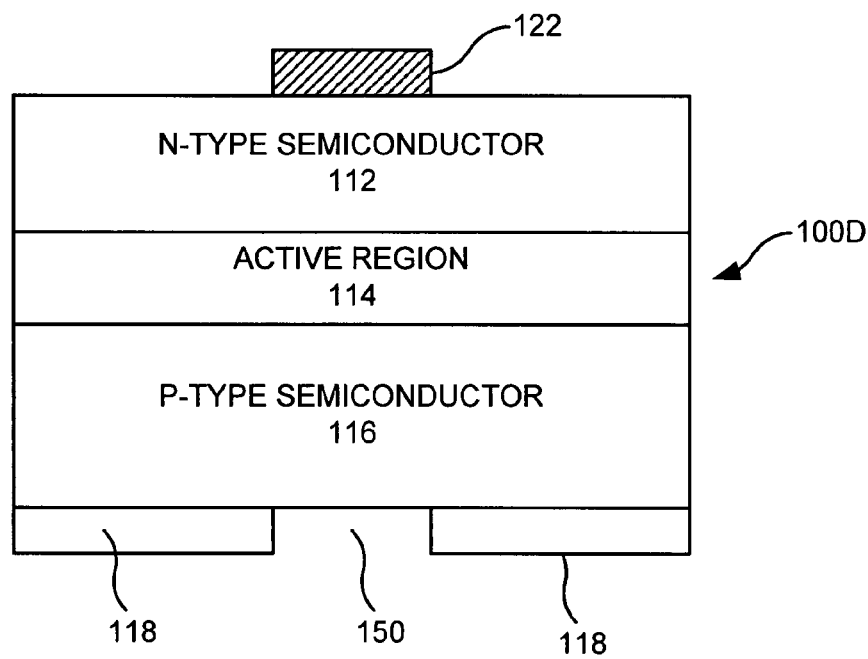

Referring to FIG. 7B, in some embodiments, the metal stack 118 may be formed on the surface of the p-type semiconductor layer 116 in regions other than an area of reduced conductivity 150 opposite the wire bond pad 122. That is, because the metal stack 118 is not formed in the area 150, a reduced current may flow through the area 150 when the device is energized, which may reduce the number of photons generated in the active layer 114 beneath the wire bond pad 122.

Figure 8:
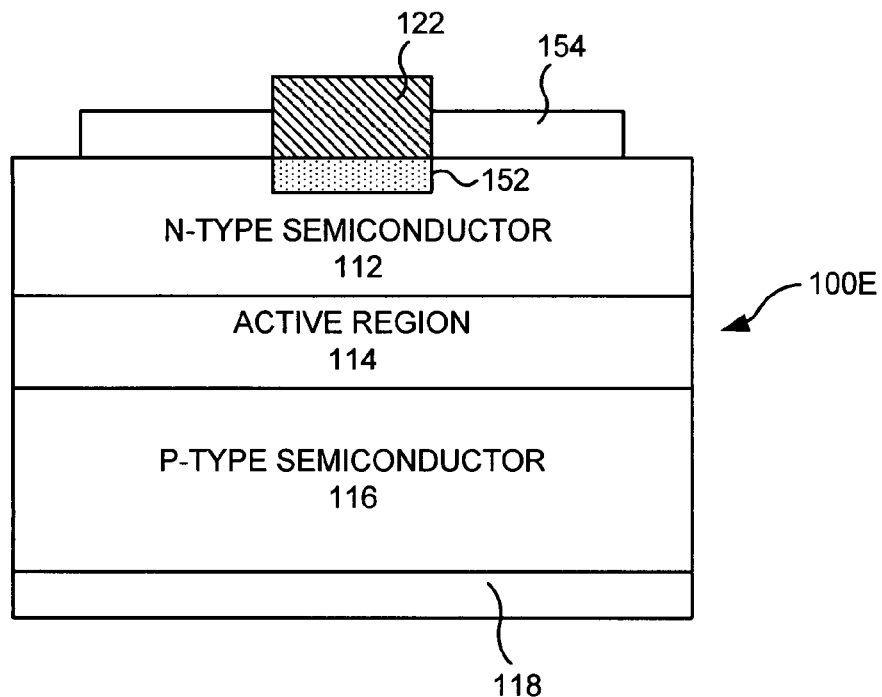

Further embodiments of the invention are illustrated in FIG. 8. In the embodiments of FIG. 8, a device 100E includes a p-type semiconductor layer 116, an active region 114, and an n-type semiconductor layer 112. A p-type contact 118 is formed on a surface of the p-type semiconductor layer 116 opposite the n-type semiconductor layer 112. A wire bond pad 122 is formed on a surface of the n-type semiconductor layer 112 opposite the p-type semiconductor layer 116. An ohmic contact 154 is formed on the same surface of the n-type semiconductor layer 112 as the wire bond pad 122, and is electrically connected to the wire bond pad 122. The ohmic contact 154 may include a transparent material that forms an ohmic contact to the n-type semiconductor layer 112, such as ITO.

A reduced conductivity region 152 is formed in the n-type semiconductor layer 112 beneath the wire bond pad 122. The reduced conductivity region 152 may extend from the surface of the n-type semiconductor layer 112 at least partially into the n-type semiconductor layer 112. In some embodiments, the reduced conductivity region 152 may extend completely through the n-type semiconductor layer 112 and to/into the active region 114.

Figure 9A:
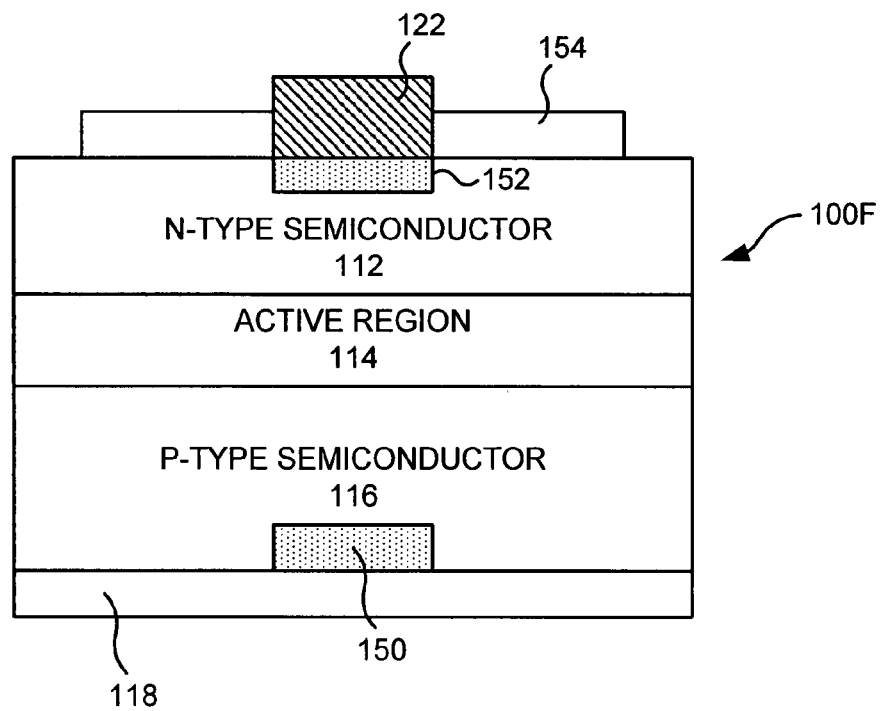

FIG. 9A illustrates a device 100F according to further embodiments of the invention. The device 100F also includes a p-type semiconductor layer 116, an active region 114, and an n-type semiconductor layer 112. A p-type contact 118 is formed on a surface of the p-type semiconductor layer 116 opposite the n-type semiconductor layer 112. A wire bond pad 122 is formed on a surface of the n-type semiconductor layer 112 opposite the p-type semiconductor layer 116. An ohmic contact 154 is formed on the same surface of the n-type semiconductor layer 112 as the wire bond pad 122.

A first reduced conductivity region 152 is formed in the n-type semiconductor layer 112 beneath the wire bond pad 122. The first reduced conductivity region 152 may be aligned with the wire bond pad 122 and may extend from the surface of the n-type semiconductor layer 112 at least partially into the n-type semiconductor layer 112. In some embodiments, the first reduced conductivity region 152 may extend completely through the n-type semiconductor layer 112 and to/into/through the active region 114.

A second reduced conductivity region 150 is formed in the p-type semiconductor layer 116. The second reduced conductivity region 150 may be aligned with the first reduced conductivity region 152 and/or the wire bond pad 122. The second reduced conductivity region 150 may extend from the surface of the p-type semiconductor layer 116 at least partially into the p-type semiconductor layer 116, and in some cases to/into/through the active region 114.

In embodiments including a reduced conductivity region 150, 152 on both sides of the device, such as the first reduced conductivity region 152 and the second reduced conductivity region 150 of the device 100F, the reduced conductivity regions 150, 152 need not be formed using the same techniques, but could, for example, be formed using different techniques. For example, the first reduced conductivity region 152 could be formed via ion implantation, while the second reduced conductivity region 150 could be formed using plasma treatment and or exposure to hydrogen gas, or vice-versa. Furthermore, one or both of the reduced conductivity regions 150, 152 could be formed by forming a non-ohmic material on the surface of the respective semiconductor layer 116, 112 prior to forming an electrical contact thereon, or by not forming the ohmic contact on an area of the surface of the semiconductor layer that corresponds to the bond pad 122.

Figure 9B:
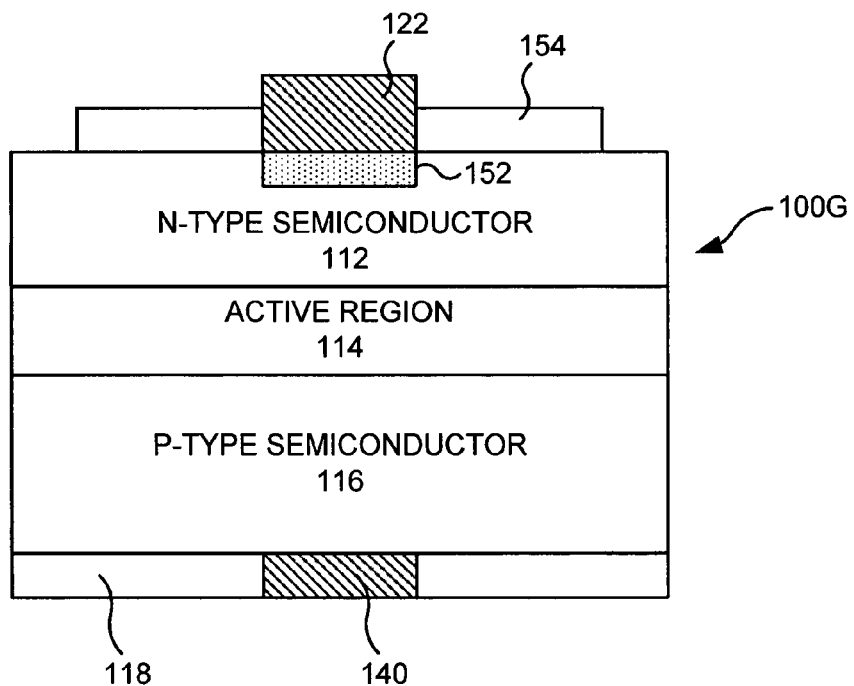

FIG. 9B illustrates a device 100G according to further embodiments of the invention. The device 100G also includes a p-type semiconductor layer 116, an active region 114, and an n-type semiconductor layer 112. A p-type contact 118 is formed on a surface of the p-type semiconductor layer 116 opposite the n-type semiconductor layer 112. A wire bond pad 122 is formed on a surface of the n-type semiconductor layer 112 opposite the p-type semiconductor layer 116. An ohmic contact 154 is formed on the same surface of the n-type semiconductor layer 112 as the wire bond pad 122.

A reduced conductivity region 152 is formed in the n-type semiconductor layer 112 beneath the wire bond pad 122. The reduced conductivity region 152 may be aligned with the wire bond pad 122 and may extend from the surface of the n-type semiconductor layer 112 at least partially into the n-type semiconductor layer 112. In some embodiments, the reduced conductivity region 152 may extend completely through the n-type semiconductor layer 112 and to/into/through the active region 114.

A metal contact 118 is formed on a surface of the p-type semiconductor layer 116 opposite the n-type semiconductor layer 112. The metal contact 118 forms on ohmic contact to the p-type semiconductor layer 116 in a region other than a reduced conductivity area of the surface of the p-type semiconductor layer 116 that is aligned with the wire bond pad 122.

The light emitting device 100G also includes a non-ohmic contact 140 on the p-type semiconductor layer 116 opposite the wire bond pad 122. In some embodiments, the non-ohmic contact 140 may include, for example, a rectifying Schottky contact. In other embodiments, the non-ohmic contact 140 may include a non-conductive material, such as silicon dioxide.

The non-ohmic contact 140 may have a shape that is about the same as the shape of the wire bond pad 122. The contact 140 may have an area that is slightly less than, about equal to, or slightly greater than the area of the wire bond pad 122. In other embodiments, the non-ohmic contact 140 may include a gap on which no contact is formed.

Figure 10:
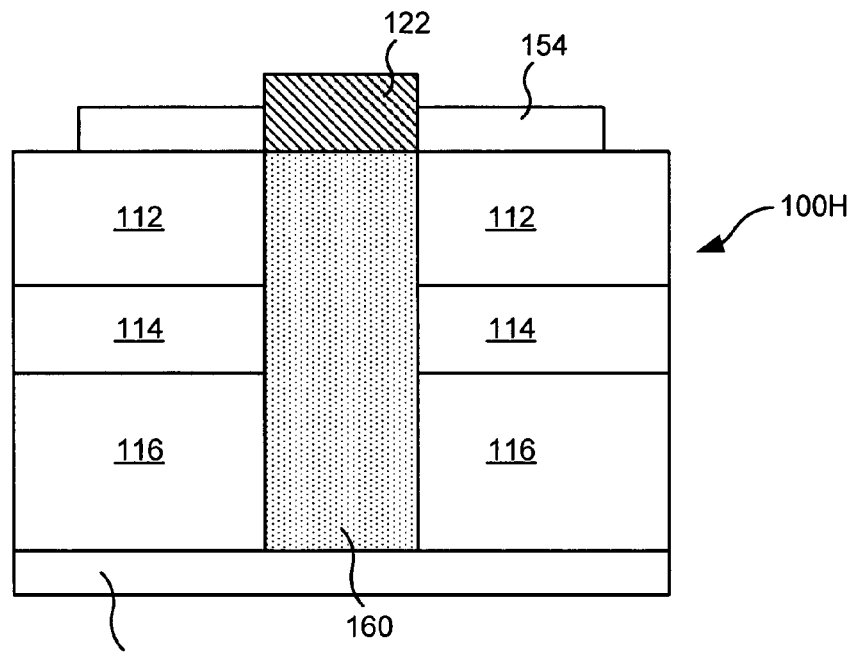

Still further embodiments of the invention are illustrated in FIG. 10, which illustrates a semiconductor light emitting device 100H that includes a reduced conductivity region 160 that extends beneath the wire bond pad 122 from a surface of the n-type semiconductor layer 112 and through the device 100G to the opposite surface of the p-type semiconductor layer 116.

Figure 12:
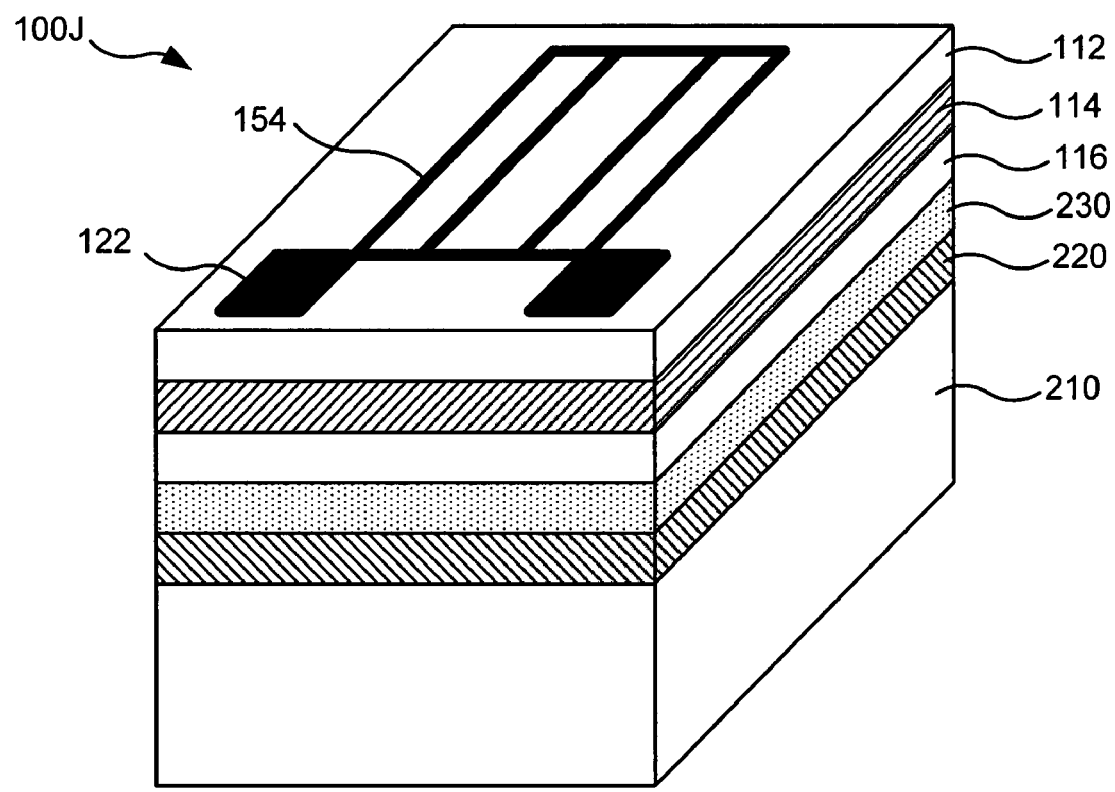
FIGS. 12 and 13 are perspective views of light emitting devices according to some embodiments of the present invention.
Figure 13:
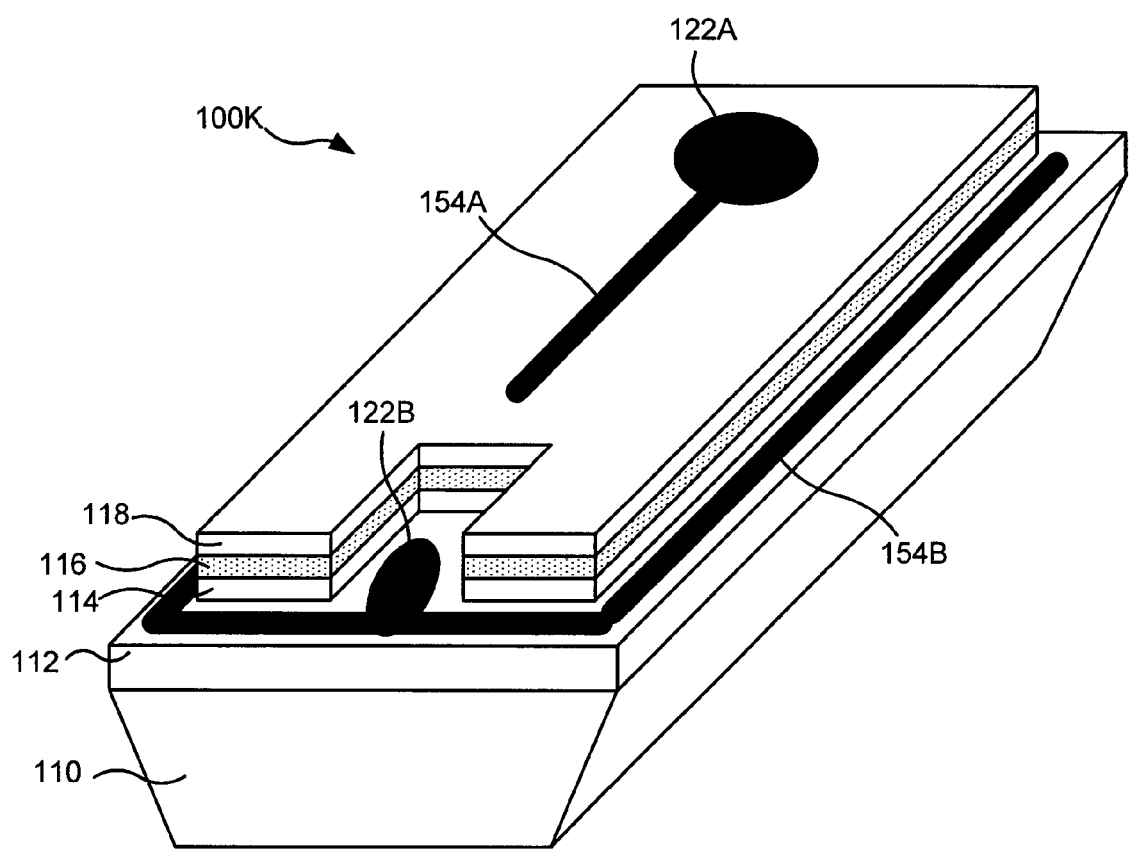

Some chip structures in which embodiments of the invention may be employed are shown in isometric view in FIGS. 12 and 13. For example, FIG. 12 illustrates a chip structure 100J including a carrier substrate 210, such as a silicon substrate, on which an LED structure has been bonded via a metal bonding layer 220. A reflective layer 230 is between the bonding layer 220 and the LED structure that includes a p-type semiconductor layer 116, an active layer 114 and an n-type semiconductor layer 112.

A pair of bond pads 122 are on the surface of the n-type semiconductor layer 112 opposite the substrate 210. The bond pads 122 are electrically connected to a current spreading structure that includes a plurality of current spreading fingers 154 on the n-type semiconductor layer 112.

The reduced conductivity region 30 may be formed underneath the bond pads 122, underneath the current spreading fingers 154, and/or under both the bond pads 122 and the current spreading fingers 154.

An exemplary horizontal chip structure 100K is illustrated in FIG. 13. The chip structure 100K includes a transparent substrate 110 on which an n-type semiconductor layer 112 is formed. A mesa structure including an active region 114 and a p-type semiconductor layer 116 is on the n-type semiconductor layer. A transparent ohmic contact 118, which may include ITO, is on the p-type semiconductor layer 116. A bond pad 122A is on the transparent ohmic contact layer 118, and a current spreading finger 154A extends from the bond pad 122A. A bond pad 122B is on the n-type semiconductor layer 112, and a current spreading finger 154B extends from the bond pad 122B. A reflective layer 23 (FIG. 1) may be provided beneath the bond pad 122A and/or the current spreading finger 154A.

The reduced conductivity region 30 may be formed underneath the bond pad 122A, underneath the current spreading fingers 154A, and/or under both the bond pad 122A and the current spreading finger 154A.

While embodiments of the present invention are illustrated in FIGS. 1-13 with reference to particular light emitting device structures, other structures may be provided according to some embodiments of the present invention. Thus, embodiments of the present invention may be provided by any light emitting structure that includes one or more of the various current blocking mechanisms as described above. For example, current blocking mechanisms according to some embodiments of the present invention may be provided in conjunction with the exemplary light emitting device structures discussed in the United States Patents and/or Applications incorporated by reference above.

Embodiments of the present invention have been described with reference to a wire bond pad 22, 122. As used herein, the term bond pad includes a light absorbing contact structure. A bond pad may be a single or multiple layers, may be a metal and/or metal alloy and/or may be of uniform of non-uniform composition.

Furthermore, while embodiments of the present invention have been described with reference to a particular sequence of operations, variations from the described sequence may be provided while still benefiting from the teachings of the present invention. Thus, two or more steps may be combined into a single step or steps performed out of the sequence described herein. For example, a reduced conductivity region may be formed in a semiconductor layer before or after forming a metal layer on the semiconductor layer. Thus, embodiments of the present invention should not be construed as limited to the particular sequence of operations described herein unless stated otherwise herein.

It will be understood by those having skill in the art that various embodiments of the invention have been described individually in connection with FIGS. 1-13. However, combinations and subcombinations of the embodiments of FIGS. 1-13 may be provided according to various embodiments of the present invention. As noted above, the reduced conductivity regions 30 may be used to reduce/prevent carrier recombination in areas of a device where generated light may be likely to be absorbed by some feature of the device, such as a bond pad, a current spreading finger, a passivation region, etc. Thus, in some embodiments, the reduced conductivity regions 30 may be aligned with light-absorbing features and/or regions of a device. However, in some cases, it may be desirable to form reduced conductivity regions 30 in other areas that are not aligned with light absorbing regions or features of a device. For example, it may be desirable to provide reduced conductivity regions 30 in a device that cause the device to generate light having a desired far-field emission pattern. Thus, in some embodiments, reduced conductivity regions 30 may be used to shape the light emission pattern of a light emitting device.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
    a p-type semiconductor layer, an n-type semiconductor layer, and an active region between the n-type semiconductor layer and the p-type semiconductor layer;
    a non-transparent feature on the p-type semiconductor layer or on the n-type semiconductor layer opposite the p-type semiconductor layer; and
    a reduced conductivity region in the p-type semiconductor layer, wherein the edges of the reduced conductivity region are aligned with the edges of the non-transparent feature, the reduced conductivity region extending from a surface of the p-type semiconductor layer opposite the n-type semiconductor layer towards the active region.

2. The light emitting device of claim 1, wherein the non-transparent region comprises a bond pad, a passivation region, and/or a current spreading finger.

3. The light emitting device of claim 1, further comprising a substrate including first and second opposing surfaces, wherein the n-type semiconductor is on the first surface of the substrate and wherein the non-transparent feature is on the second surface of the substrate opposite the n-type semiconductor layer.

4. The light emitting device of claim 1, further comprising a metal stack on the surface of the p-type semiconductor layer.

5. The light emitting device of claim 4, wherein the metal stack comprises an ohmic layer directly on the p-type semiconductor layer, and a reflective layer on the ohmic layer.

6. The light emitting device of claim 5, wherein the metal stack comprises a bonding layer on the reflective layer.

7. The light emitting device of claim 5, further comprising a barrier layer between the reflective layer and the bonding layer.

8. The light emitting device of claim 1, wherein the reduced conductivity region extends from the surface of the p-type semiconductor layer to the active region.

9. The light emitting device of claim 1, wherein the reduced conductivity region extends from the surface of the p-type semiconductor layer into the active region.

10. The light emitting device of claim 1, wherein the reduced conductivity region extends from the surface of the p-type semiconductor layer through the active region.

11. A light emitting device, comprising:
    a p-type semiconductor layer, an n-type semiconductor layer, and an active region between the n-type semiconductor layer and the p-type semiconductor layer;
    a non-transparent feature on the p-type semiconductor layer or on the n-type semiconductor layer opposite the p-type semiconductor layer; and
    a reduced conductivity region in the p-type semiconductor layer and aligned with the non-transparent feature, the reduced conductivity region extending from a surface of the p-type semiconductor layer opposite the n-type semiconductor layer towards the active region, wherein the reduced conductivity region extends through the p-type semiconductor layer, the active region and into the n-type semiconductor layer.

12. The light emitting device of claim 11, wherein the non-transparent feature comprises a wire bond pad in contact with the reduced conductivity region, the light emitting device further comprising an ohmic contact on the n-type semiconductor layer adjacent and in electrical contact with the wire bond pad.

13. The light emitting device of claim 1, wherein the reduced conductivity region extends completely through the n-type semiconductor layer.

14. The light emitting device of claim 11, wherein the active region comprises a Group III-nitride based active region.

15. The light emitting device of claim 1, wherein the reduced conductivity region comprises an insulating region.

16. The light emitting device of claim 11, wherein the reduced conductivity region comprises a region that is not non-transparent.

17. The light emitting device of claim 1, wherein the reduced conductivity region comprises an implanted region.

18. The light emitting device of claim 11, further comprising a metal stack on the surface of the p-type semiconductor layer wherein the reduced conductivity region corresponds to a region of damage at an interface between the metal stack and the p-type semiconductor layer.

19. The light emitting device of claim 18, wherein the region of damage comprises a wet or dry etched region of the p-type semiconductor layer.

20. The light emitting device of claim 18, wherein the region of damage comprises a region of the p-type semiconductor layer exposed to a high energy plasma.

21. The light emitting device of claim 18, wherein the region of damage comprises a region of the p-type semiconductor layer exposed to $H_2$.

22. The light emitting device of claim 18, wherein the region of damage comprises a region of the p-type semiconductor layer exposed to a high energy laser.

23. A light emitting device, comprising:
    a p-type semiconductor layer, an n-type semiconductor layer, and an active region between the n-type semiconductor layer and the p-type semiconductor layer;
    a non-transparent feature on the n-type semiconductor layer opposite the p-type semiconductor layer; and a metal contact on a surface of the p-type semiconductor layer opposite the n-type semiconductor layer, wherein the metal contact forms on ohmic contact to the p-type semiconductor layer in a region other than a reduced conductivity area of the surface of the p-type semiconductor layer that is aligned with the non-transparent feature.

24. The light emitting device of claim 23, wherein the non-transparent region comprises a bond pad, a passivation region, and/or a current spreading finger.

25. The light emitting device of claim 23, further comprising a reduced conductivity region in the p-type semiconductor layer and aligned with the non-transparent feature and the reduced conductivity area, the reduced conductivity region extending from the surface of the p-type semiconductor layer towards the active region.

26. The light emitting device of claim 23, further comprising a reduced conductivity region in the n-type semiconductor layer and aligned with the non-transparent feature, the reduced conductivity region extending from a surface of the n-type semiconductor layer opposite the p-type semiconductor layer towards the active region.

27. The light emitting device of claim 23, further comprising a non-ohmic contact on the surface of the p-type semiconductor layer.

28. The light emitting device of claim 27, wherein the non-ohmic contact comprises a metal that does not form an ohmic contact with the p-type semiconductor layer.

29. The light emitting device of claim 27, wherein the non-ohmic contact comprises an insulator on the surface of the p-type semiconductor layer.

30. A light emitting device, comprising:
a p-type semiconductor layer, an n-type semiconductor layer, and an active region between the n-type semiconductor layer and the p-type semiconductor layer;
a wire bond pad on the n-type semiconductor layer opposite the p-type semiconductor layer;
a reduced conductivity region in the n-type semiconductor layer and aligned with the wire bond pad, the reduced conductivity region extending from a surface of the n-type semiconductor layer opposite the p-type semiconductor layer towards the active region; and
an ohmic contact on the n-type semiconductor layer adjacent and in electrical contact with the wire bond pad.

31. The light emitting device of claim 30, further comprising a metal stack on a surface of the p-type semiconductor layer opposite the n-type semiconductor layer.

32. The light emitting device of claim 31, wherein the metal stack comprises an ohmic layer directly on the p-type semiconductor layer, and a reflective layer on the ohmic layer.

33. The light emitting device of claim 32, wherein the metal stack comprises a bonding layer on the reflective layer.

34. The light emitting device of claim 30, wherein the reduced conductivity region comprises a first reduced conductivity region, the light emitting device further comprising a second reduced conductivity region in the p-type semiconductor layer and aligned with the wire bond pad, the second reduced conductivity region extending from a surface of the p-type semiconductor layer opposite the n-type semiconductor layer towards the active region.

35. The light emitting device of claim 30, further comprising a metal contact on a surface of the p-type semiconductor layer opposite the n-type semiconductor layer, wherein the metal contact forms on ohmic contact to the p-type semiconductor layer in a region other than a reduced conductivity area of the surface of the p-type semiconductor layer that is aligned with the wire bond pad.

36. The light emitting device of claim 30, further comprising a non-ohmic contact on the reduced conductivity area of the surface of the p-type semiconductor layer.

37. The light emitting device of claim 36, wherein the non-ohmic contact comprises a metal that does not form an ohmic contact with the p-type semiconductor layer.

38. The light emitting device of claim 36, wherein the non-ohmic contact comprises an insulator on the surface of the p-type semiconductor layer.

39. The light emitting device of claim 30, wherein the reduced conductivity region corresponds to a region of damage at an interface between the n-type semiconductor layer and the wire bond pad.

40. The light emitting device of claim 39, wherein the region of damage comprises a wet or dry etched region of the n-type semiconductor layer.

41. The light emitting device of claim 39, wherein the region of damage comprises a region of the n-type semiconductor layer exposed to a high energy plasma.

42. The light emitting device of claim 39, wherein the region of damage comprises a region of the n-type semiconductor layer exposed to $H_2$.

43. The light emitting device of claim 39, wherein the region of damage comprises a region of the n-type semiconductor layer exposed to a high energy laser.

44. A light emitting device, comprising:
a p-type semiconductor layer, an n-type semiconductor layer, and an active region between the n-type semiconductor layer and the p-type semiconductor layer;
a bond pad on the p-type semiconductor layer opposite the n-type semiconductor layer; and
a reduced conductivity region in the p-type semiconductor layer, wherein the edges of the reduced conductivity region are aligned with the edges of the bond pad, the reduced conductivity region extending from a surface of the p-type semiconductor layer opposite the n-type semiconductor layer towards the active region.

45. A light emitting device, comprising:
a p-type semiconductor layer, an n-type semiconductor layer, and an active region between the n-type semiconductor layer and the p-type semiconductor layer;
a bond pad on the p-type semiconductor layer opposite the n-type semiconductor layer;
a reduced conductivity region in the semiconductor layer aligned with the bond pad, the reduced conductivity region extending from a surface of the p-type semiconductor layer opposite the n-type semiconductor layer towards the active region; and
a reflector between the bondpad and the p-type semiconductor layer.

46. The light emitting device of claim 45, further comprising a current spreading finger on the p-type semiconductor layer, wherein the reduced conductivity region is further aligned with the current spreading finger.

47. The light emitting device of claim 1, wherein the non-transparent feature is on the n-type semiconductor layer opposite the p-type semiconductor layer.

* * * * *

UNITED STATES PATENT AND TRADEMARK OFFICE
CERTIFICATE OF CORRECTION

| | | |
|---|---|---|
| PATENT NO. | : 7,795,623 B2 | Page 1 of 1 |
| APPLICATION NO. | : 11/715687 | |
| DATED | : September 14, 2010 | |
| INVENTOR(S) | : Emerson et al. | |

It is certified that error appears in the above-identified patent and that said Letters Patent is hereby corrected as shown below:

On Title Page:
Item (63) Related U.S. Application Data: Please correct "application No. 11/881,814" to read -- application No. 10/881,814 --

In the Claims:
Column 20, Claim 45, Line 48: Please correct "in the semiconductor layer" to read -- in the p-type semiconductor layer, and --

Signed and Sealed this
First Day of March, 2011

David J. Kappos
*Director of the United States Patent and Trademark Office*